United States Patent
Whisenand et al.

(10) Patent No.: US 9,063,191 B2
(45) Date of Patent: Jun. 23, 2015

(54) ELECTRICAL TEST DEVICE AND METHOD

(75) Inventors: Jeff Whisenand, Fullerton, CA (US); Randy Cruz, La Habra, CA (US)

(73) Assignee: Power Probe, Inc., Brea, CA (US)

( * ) Notice: Subject to any disclaimer, the term of this patent is extended or adjusted under 35 U.S.C. 154(b) by 528 days.

(21) Appl. No.: 13/404,644

(22) Filed: Feb. 24, 2012

(65) Prior Publication Data

US 2013/0221973 A1  Aug. 29, 2013

(51) Int. Cl.
*G01R 31/00* (2006.01)
*G01R 31/12* (2006.01)

(52) U.S. Cl.
CPC .......... *G01R 31/1272* (2013.01); *G01R 31/007* (2013.01)

(58) Field of Classification Search
CPC ............. G01R 31/1272; G01R 31/007; G01R 1/06794; G01R 31/025; G01R 19/16561; G01R 31/02–31/12
USPC .................................. 324/501, 539–544, 500
See application file for complete search history.

(56) References Cited

U.S. PATENT DOCUMENTS

| | | | |
|---|---|---|---|
| 4,758,792 A | 7/1988 | Polonis et al. | |
| 4,983,910 A | 1/1991 | Bloom | |
| 5,064,987 A | 11/1991 | Braman | |
| 5,367,250 A | 11/1994 | Whisenand | |
| 6,459,968 B1 * | 10/2002 | Kochie | 701/31.4 |
| 6,608,486 B1 * | 8/2003 | Betts | 324/503 |
| 6,653,745 B1 * | 11/2003 | Masaki et al. | 307/10.1 |
| 6,977,493 B2 * | 12/2005 | Novak et al. | 324/72.5 |
| 7,184,899 B2 | 2/2007 | Cruz | |
| 2003/0128036 A1 * | 7/2003 | Henningson et al. | 324/426 |
| 2003/0184932 A1 * | 10/2003 | McNally et al. | 361/42 |
| 2008/0106832 A1 | 5/2008 | Restrepo et al. | |
| 2011/0025356 A1 * | 2/2011 | Nielsen et al. | 324/754.1 |
| 2011/0238345 A1 | 9/2011 | Gauthier et al. | |

OTHER PUBLICATIONS

Yokogawa, Source Measure Unit GS610 , Jul. 2005.*
International Search Report for PCT/US2013/027195, mailed May 13, 2013.

* cited by examiner

*Primary Examiner* — Patrick Assouad
*Assistant Examiner* — Demetrius Pretlow
(74) *Attorney, Agent, or Firm* — Rutan & Tucker LLP; Hani Z. Sayed

(57) ABSTRACT

An electrical test device may include a power supply, a conductive probe element, and a spectral analysis block. The conductive probe element may be energized by a power supply. The probe element may be placed in contact with an electrical system under test and apply an input signal containing current for measuring at least one parameter of the electrical system. The spectral analysis block may be connected to the probe element and may receive an output signal from the electrical system in response to the application of the current to the electrical system. The spectral analysis block may analyze frequency spectra of the output signal and detect a broadband increase in energy of the frequency spectra above a predetermined energy threshold. The broadband increase in energy may be representative of the occurrence of arcing in the electrical system.

10 Claims, 9 Drawing Sheets

ELECTRICAL TEST DEVICE AND METHOD

CROSS-REFERENCE TO RELATED APPLICATIONS

The present application is related to U.S. Pat. No. 7,184,899, issued on Feb. 27, 2007 to Randy Cruz, and which is entitled ENERGIZABLE ELECTRICAL TEST DEVICE FOR MEASURING CURRENT AND RESISTANCE OF AN ELECTRICAL CIRCUIT, and to U.S. Pat. No. 5,367,250, issued on Nov. 22, 1994 to Jeff Whisenand, and which is entitled ELECTRICAL TESTER WITH ELECTRICAL ENERGIZABLE TEST PROBE, the entire contents of U.S. Pat. Nos. 7,184,899 and 5,367,250 being expressly incorporated by reference herein.

FIELD

The present disclosure relates generally to electrical test equipment and, more particularly, to an electrical test device configured to diagnose one or more faults in an electrical system under test during the application of current to the electrical system.

BACKGROUND

Motor vehicles such as automobiles are increasingly dependant upon electronic circuitry for operation and require increasing levels of sophistication to efficiently diagnose and repair such motor vehicles. A wide variety of faults may occur in automotive electrical systems including short circuits, open circuits, and failed components such as failed connections, relays, switches, and computer modules. Another type of fault that may occur in electrical systems is arcing. Arcing may be defined as unwanted electric spark or arc jumping a gap between two isolated nodes or conductors and may occur on an intermittent or impulsive basis within an electrical system.

Arcing may be caused be the presence of solid or liquid contamination, by the presence of moisture in an electrical system, by carbon tracks from decaying plastics, and by other causes, all of which may lead to an increased probability of an electric spark jumping a gap between two isolated nodes. The occurrence of arcing may lead to improper operation and/or damage to the electrical system which may include pitting in a relay, surface damage to a conductor, premature electrical failure, or fire.

Known conventional multi-meters lack the capability to detect the occurrence of arcing. Because arcing can be the cause of an existing failure in an electrical system or a potential failure in an electrical system, the ability to identify and detect the occurrence of arcing is highly beneficial. For example, the ability to identify and detect the occurrence of arcing may allow a technician to diagnose and repair a malfunction in an electrical system before permanent damage occurs. In addition, the identification of arcing can itself be an indicator that permanent failure has occurred in an electrical system such that the technician may then repair or replace a damaged component or module.

Another type of fault that may be difficult to detect in an electrical system is a loss of integrity in low-resistance or low-impedance electrical paths that carry relatively high-amperage current to various locations within the electrical system. For example, such electrical paths may include a battery cable of a motor vehicle carrying current from the battery to the starter. The electrical resistance of such cables is relatively low due to the large diameter of such cables making measurement of the resistance difficult using conventional multi-meters. Specialized micro-ohm meters may be used to measure the resistance in such cables. Unfortunately, the testing of a low-resistance cable using a micro-ohm meter typically requires the disconnection or removal of the cable from the electrical system. Furthermore, such micro-ohm meters may apply a relatively high-amperage test current to the cable which could damage sensitive electrical components if the high-amperage test current were inadvertently applied for an extended period of time.

As can be seen, there exists a need in the art for a system and method for detecting the presence of arcing in an electrical system. In addition, there exists a need in the art for evaluating the integrity of relatively low-resistance electrical paths or cables of an electrical system. Furthermore, there exists a need in the art for evaluating the integrity of relatively low-resistance electrical paths or cables without requiring the disconnection or removal of such electrical paths or cables from the electrical system.

BRIEF SUMMARY

The above-noted needs associated with electrical test devices are specifically addressed and alleviated by the present disclosure which, in an embodiment, provides a test device comprising a power supply, a conductive probe element, and a spectral analyzer. The power supply may be connected to an external power source. The conductive probe element may be configured to be energized by the power supply and may be placed in contact with an electrical system for application of an input signal containing current for measuring at least one parameter of the electrical system. The spectral analyzer may be connected to the probe element and may be configured to receive an output signal from the electrical system in response to the application of the input signal. The spectral analyzer may analyze the frequency spectra of the output signal. The frequency spectra may have a low-frequency portion and a high-frequency portion and may contain energy contributed by periodic signals and non-periodic signals. The spectral analyzer may analyze the low-frequency portion and detect the potential occurrence of arcing when the energy contributed by the non-periodic signals exceeds a predetermined energy threshold in the low-frequency portion. The spectral analyzer may then analyze the high-frequency portion when the energy in the low-frequency portion exceeds the energy threshold. The spectral analyzer may detect the occurrence of arcing in the electrical system when the energy in the high-frequency portion exceeds the energy threshold.

Also disclosed is a method of detecting arcing in an electrical system. The method may comprise the step of placing a probe element in contact with an electrical system. The method may further include the step of providing power to the probe element from an external power source. An input signal containing current may be applied to the electrical system such as by using a probe element. The method may include the step of receiving an output signal from the electrical system in response to the application of the input signal. The method may further include analyzing the frequency spectra of the output signal wherein the frequency spectra has a low-frequency portion and a high-frequency portion and contains energy contributed by the periodic and non-periodic signals. The method may include analyzing the low-frequency portion and detecting the potential occurrence of arcing in the electrical system when the energy contributed by the non-periodic signals in the low-frequency portion exceeds a predetermined energy threshold. In addition, the method may include analyzing the high-frequency portion when the energy in the low-frequency portion exceeds the energy threshold. The occurrence of arcing in the electrical system may be determined when the energy in the high-frequency portion exceeds the energy threshold.

Also disclosed is a test device for assessing or testing the integrity of a relatively low-impedance electrical path such as a cable. The test device may include a power supply, a probe element, and a processor. The power supply may be connected to an external power source. The probe element may be placed in contact with the electrical path and may be energized by the power supply for applying an input signal of relatively low amperage to the electrical path. The processor may receive an output signal from the electrical path and determine a first voltage across the electrical path in response to application of the low-amperage input signal. The processor may further be configured to apply a relatively high-amperage current pulse to the electrical path and determine a second voltage across the electrical path in response to application of the high-amperage current pulse. In addition, the processor may determine a volt drop across the electrical path based upon the difference between the first voltage and the second voltage. The processor may calculate an electrical resistance of the electrical path based upon the voltage drop.

Also disclosed is a method of measuring a voltage drop in a relatively low-impedance electrical path. The method may comprise the steps of placing a probe element in contact with the electrical path. The probe element may be energized from a power supply. A relatively low-amperage input signal may be applied to the electrical path using the probe element. The method may include determining a first voltage across an electrical path in response to application of the low-amperage input signal. The method may further include applying a relatively high-amperage current pulse to the electrical path and determining a second voltage across the electrical path in response to the application of the high-amperage current pulse. The method may additionally include determining a voltage drop across the electrical path based upon the difference between the first voltage and the second voltage. The method may further include providing a pass/fail notification regarding whether the measured voltage drop exceeds a maximum specified voltage drop for the electrical path. Alternatively, the method may include providing a pass/fail indication of whether the calculated electrical resistance of the electrical path falls within a specified operating range.

The features, functions and advantages that have been discussed can be achieved independently in various embodiments of the present disclosure or may be combined in yet other embodiments, further details of which can be seen with reference to the following description and drawings below.

BRIEF DESCRIPTION OF THE DRAWINGS

These and other features of the present disclosure will become more apparent upon reference to the drawings wherein like numerals refer to like parts throughout and wherein.

DETAILED DESCRIPTION

Figure 1:
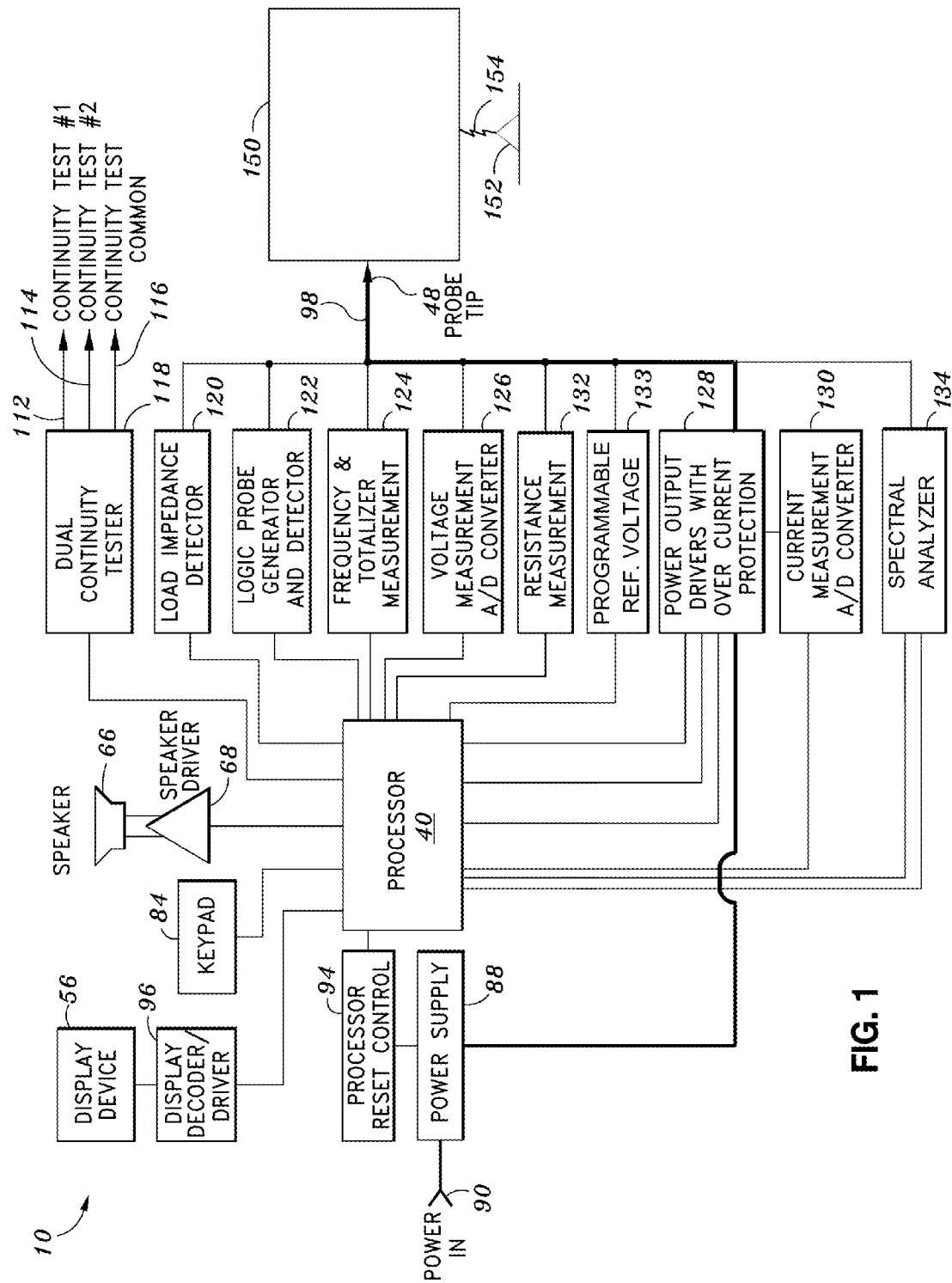
FIG. 1 is a block diagram of an embodiment of an electrical test device and which may include a power supply, a processor, a display device, a keypad, and an energizable probe element.

Referring now to the drawings wherein the showings are for purposes of illustrating various aspects of the present disclosure, shown in FIG. 1 is an electrical test device 10 that is configured for providing current sourcing or power to an electrical system 150 under test while simultaneously providing multi-meter functionality for measurement of one or more parameters of the electrical system 150. In addition, the electrical test device 10 disclosed herein is configured to monitor the electrical system 150 under test for arcing behavior in the presence of non-arcing signals while simultaneously measuring one or more parameters of the electrical system 150.

The electrical test device 10 disclosed herein is also configured to measure the integrity of low-impedance or low-resistance electrical paths 156 (FIGS. 9A-9B) such as a battery cable (not shown) extending between a battery (not shown) and a starter (not shown) of a motor vehicle (not shown). Advantageously, the test device 10 provides a means for measuring electrical resistance in low-impedance electrical paths 156 by providing a relatively high-amperage current pulse to generate a voltage drop that can be accurately measured. Once the voltage drop has been acquired, the test device 10 may calculate the electrical resistance and determine whether an electrical path 156 or cable is functioning properly. Advantageously, the determination of the electrical resistance of such electrical path 156 using the test device 10 disclosed herein may be performed without disconnecting or removing the suspect electrical path 156 or cable.

The test device 10, advantageously, may also allow for automatically detecting and/or sequentially measuring several parameters of an electrical system 150 without user intervention. More particularly, the test device 10 is configured to allow for sequentially moving through the measurement of one or more parameters including, but not limited to, voltage, resistance, frequency, and other parameters. The test device 10 may measure and display one or more parameters for which a signal is available or for which testing conditions facilitate the measurement of such parameters. In this regard, the test device 10 is configured to allow the sequential measurement of several parameters without requiring manual manipulation or selection of the parameter to be measured.

In any one of the embodiments disclosed herein, the test device 10 may be configured to provide current flow through an electrical system 150 and may characterize or measure one or more parameters of the electrical system 150 including, but not limited to, impedance, wave form (e.g., fluctuation, frequency/speed), and current drain in addition to measurements performed by conventional multi-meters such as voltage, current, and electrical resistance. Advantageously, the unique configuration of the test device 10 disclosed herein eliminates the need for clip-on current sensors as may be required in conventional electrical test devices 10. In addition, the unique configuration of the electrical test device 10 as disclosed herein may eliminate the need for a separate power cable and probe element 50 connection.

Referring to FIG. 1, shown is a block diagram of the electrical test device 10 which may comprise a conductive probe element 50, a power supply 88, a processor 92, and a display device 54. Importantly, the test device 10 may be configured to allow for selective powering of the electrical system 150 under test upon energization of the probe element 50 while parameters of the electrical system 150 are being measured. In the block diagram, shown are several functional blocks corresponding to the various measurement capabilities of the test device 10. Each one of the functional blocks may be integrated with the processor 92 or may be under the control of the processor 92 which, as is shown in FIG. 1, may be configured as a microprocessor. The conductive probe element 50 may be coupled to the processor 92 and/or one or more of the functional blocks. The probe element 50 may be configured to be placed in contact with the electrical system 150 under test and provide an input signal to the electrical system 150. The probe element 50 may be connected to a power supply 88 which may receive power from external power source 90. The power source may be a battery such as a battery of a motor vehicle containing the electrical system 150 under test. However, the external power source 90 is not limited to a battery of a motor vehicle and may be provided in alternative configurations.

Referring still to FIG. 1, the power supply 88 may be connected to a reset control such as a microprocessor reset control 94. The microprocessor reset control 94 may be comprised of circuitry that may provide a reset signal to the processor 92 or microprocessor under certain conditions such as when the operating voltage is out of tolerance. The power supply 88 is preferably configured to provide a voltage-regulated output for all circuitry contained within the electrical test device 10. Preferably, the voltage-regulated output may be provided independent of any input signal to the electrical system 150.

The microprocessor reset control 94 may be electrically connected to the processor 92 or microprocessor. The processor 92 or microprocessor may be electrically connected to the probe element 50 and may be configured to manipulate the input signal that is provided to the electrical system 150 and to receive the output signal in response to application of the input signal. The output signal may be representative of the measurement of at least one or more of the parameters of the electrical system 150 under test as indicated above. In manipulating and controlling the electrical test device 10 measurement functions, the processor 92 or microprocessor may be provided with an executable software program configured to provide control of the various measurement processes of the electrical test device 10. In this manner, the processor 92 or microprocessor may regulate or control substantially all of the functions of the electrical test device 10.

In FIG. 1, the electrical test device 10 may include a display device 54 which may be electrically connected to the processor 92 or microprocessor. The display device 54 may be configured to display a reading or indication of the output signal that may be extracted from the electrical system 150 during testing. The reading on the display device 54 may be representative of the parameter being measured. However, the test device 10 may also include an audible device for providing an audible indication of operating parameters being measured in the electrical system 150. For example, the audible device may comprise a piezo element such as a piezo disk. The piezo disk may act as a speaker 66 for providing an indication regarding continuity measurements and/or voltage polarity of the electrical system 150 under test.

As was earlier indicated, the electrical test device 10 may be configured to allow for selective powering or current sourcing to the electrical system 150 upon energization of the probe element 50 during measurement of the parameters of the electrical system 150. In this regard, the electrical test device 10 may be configured to automatically switch between an active mode and a passive mode. The active mode may be defined by measurement of one or more parameters of the electrical system 150 during the application of current or power to the electrical system 150. As was previously indicated, such current or power may ultimately be supplied by an external power source 90 and which may be passed through the power supply 88 and into the probe element 50. In this manner, the probe element 50 may apply current to the electrical system 150 under test. The passive mode of the electrical test device 10 may be defined by measurement of one or more parameters of the electrical system 150 without the application of power or current to the electrical system 150. The application of power or current to the electrical system 150 may be controlled by a button or switch on the keypad or on the display device 54 and which may be connected to the processor 92 or microprocessor as illustrated in FIG. 1. The display device 54 may operative to indicate whether the test device 10 is in the passive mode or in the active mode.

In an embodiment, the display device 54 may be configured as a liquid crystal display or any other suitable configuration of the display device 54. The test device 10 may also include a speaker driver that may be connected to the speaker 66 (e.g., the piezo element) and which may format and convert signals received from the processor 92 or microprocessor such that the speaker 66 may provide audible indications. In this same regard, the display driver illustrated in FIG. 1 may be connected between the processor 92 or microprocessor and/or the display device 54 and may also format and convert signals from the processor 92 or microprocessor into a format required for display by the display device 54.

Referring still to FIG. 1, shown are the functional blocks that may be representative of the measurement capabilities and features of the test device 10. Included with the functional blocks are a dual continuity tester 118, load impedance detector 120, logic probe detector and generator 122, frequency and totalizer measurement 124, voltage measurement 126, resistance measurement 132, programmable reference voltage 133, power output driver with over current protection 128, current measurement with analog/digital (A/D) conversion 130, and spectral analyzer 134. Advantageously, due to the unique configuration of the test device 10 illustrated in the block diagram in the FIG. 1, the test device 10 may simultaneously measure current, voltage, and other parameters of the electrical system 150 during the application of current sourcing into the electrical system 150 under test.

Although each one of the functional blocks is indicated as a separate block, componentry may be shared between the functional blocks to facilitate one or more measurements of the electrical system 150. Furthermore, as shown in FIG. 1, each one of the functional blocks may be connected to or integrated with the processor 92 or microprocessor which may control the overall operation of the electrical test device 10. The dual continuity tester 118 functionality block shown in FIG. 1 may be used in conjunction with the current source provided by the probe element 50 when energized by the power supply 88. The electrical test device 10 disclosed herein is related to U.S. Pat. No. 5,367,250, issued to Jeff Whisenand on Nov. 22, 1994 and which is entitled "Electrical Tester with Electrical Energizable Test Probe", herein incorporated by reference in its entirety. The test device 10 disclosed herein is also related to U.S. Pat. No. 7,184,899, issued on Feb. 27, 2007 to Randy Cruz, and which is entitled "Energizable Electrical Test device 10 for Measuring Current and Resistance of an Electrical Circuit", herein incorporated by reference in its entirety.

Referring to FIG. 1, the test device 10 disclosed may include the dual continuity tester 118 which may operate in conjunction with one or more signal lamps 58 to provide a convenient means for testing the functionality of multi-pole relays (not shown). More specifically, the dual continuity tester 118 as incorporated into the test device 10 shown in FIG. 1 may be configured to allow for testing of multiple contacts (not shown) with the pressing of a single button on the keyboard wherein the coil resistance of a relay may be easily measured. In addition, other test parameters may be obtained. The dual continuity tester 118, when coupled with the measurement functionality of the test device 10, enables the testing of contact switches (not shown) and relay devices. For example, in an electrical system 150 having two relays, the dual continuity tester 118 may provide for the capability of determining which one of two relays is activated and/or which one of the relays is deactivated. In this manner, the dual continuity tester 118 allows for checking of relays using a pair of signal lamps 58 or using other indicating means. When testing relays or switches, the speaker 66 may preferably be inoperative in order to avoid producing audible signals that may otherwise interfere with detection of noises in the relay switches and which may be indicative of a properly-functioning switch. However, the signal lamps 58 and/or the audible device may be used to provide an indication as to the activated or deactivated state of the relays. Furthermore, the dual continuity tester 118 may facilitate the checking of the status and operability of multiple contacts such as in a multi-pole/multi-contact relay or switch.

Referring still to FIG. 1, the load impedance detector 120 functional block allows for measurement of the magnitude of a voltage drop in an electrical system 150 such as when testing electrical junctions in an electrical circuit. The load impedance detector 120 functional block may facilitate testing a power feed 164 that may have loose or corroded connections. As will be described in greater detail below, when the probe element 50 is connected to the electrical system 150 under test, the impedance of the electrical system 150 may be tested and the electrical test device 10 may provide an indication, either audibly via the speaker 66 and/or visually via the display device 54 (i.e., the LCD 56), when a set point (i.e., a predetermined voltage level) is above a maximum specified voltage limit. The predetermined voltage level may be adjusted using the programmable reference voltage 133 block shown in FIG. 1.

The logic probe generator and detector 122 functional block may comprise a circuit that creates a sequence for outputting a signal into a device (not shown) of the electrical system 150 through the probe element 50. For example, a digital pulse train may be inputted into a device of the electrical system 150 with the digital pulse train inserted into a terminal of a device under test in order to assess communication between components of the electrical system 150 (e.g., between an odometer of a motor vehicle in communication with a control unit of the motor vehicle). The logic probe generator and detector 122 functionality may also provide the electrical test device 10 with the capability to measure signal levels as well as frequency. High and low logic levels may be generated as well as pulse trains at various frequencies.

The frequency and totalizer measurement 124 functional block may allow the electrical test device 10 to assess the rate of voltage or current fluctuation in the electrical system 150 under test, and to accumulate occurrences of a particular state over time. Circuitry of the frequency and totalizer measurement 124 block may allow for processing of signal transition of a waveform in order to extract the frequency, revolutions per minute (RPM), duty cycle and number of pulses from a signal. The frequency aspect of the frequency and totalizer measurement 124 functional block may allow for determining the frequency or RPM or duty cycle component of the electrical system 150. The totalizer aspect of the frequency and totalizer measurement 124 functional block may accumulate pulses or cycles and allows the electrical test device 10 to measure and check for intermittent output signals from the electrical system 150 under test. The frequency and totalizer measurement 124 functional block may also provide a means for checking switches in an electrical system 150 by providing a means for measuring the number of times that a contact within a switch bounces, for example, such as may occur in a relay switch.

The voltage measurement 126 block may allow for high speed voltage measurement 126 in the electrical system 150. The voltage measurement 126 block may represent the ability of the electrical test device 10 to sample and detect positive and negative peaks of a signal as well as detecting and measuring an average of the signals and displaying results of the signal readout on the display device 54. The voltage measurement 126 block may simplify voltage drop tests, voltage transient tests, and voltage fluctuation or ripple tests. The power output driver with over current protection 128 functional block may provide a buffer stage or a transistor for the electrical test device 10 such that the power output driver with over current protection 128 may regulate the amount of current that may be passed from the power supply 88 to the probe element 50 and ultimately into the electrical system 150 under test. In addition, the power output driver 128 may establish an appropriate drive impedance and protect the electrical test device 10 from damage due to automotive transients. The current measurement 130 functional block may allow for high speed current measurement 130 by the electrical test device 10 such as sampling and detection of current consumed in a load provided in the input signal which is inserted into the electrical system 150. Such consumed current may be displayed on the display device 54.

Figure 2:
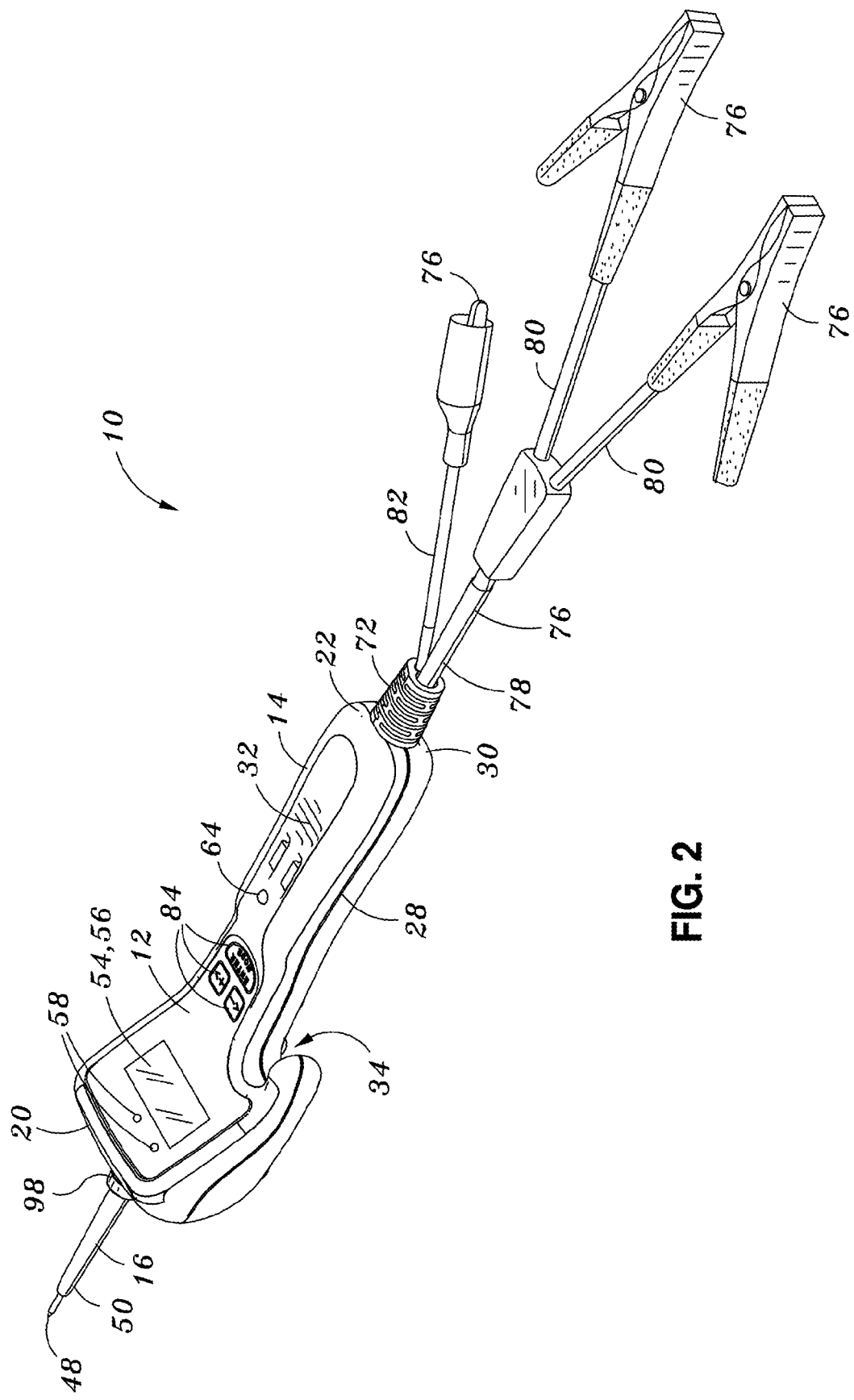
FIG. 2 is a perspective illustration of an embodiment of the electrical test device illustrating a pair of power leads and a ground lead that may be included with the electrical test device.
Figure 3:
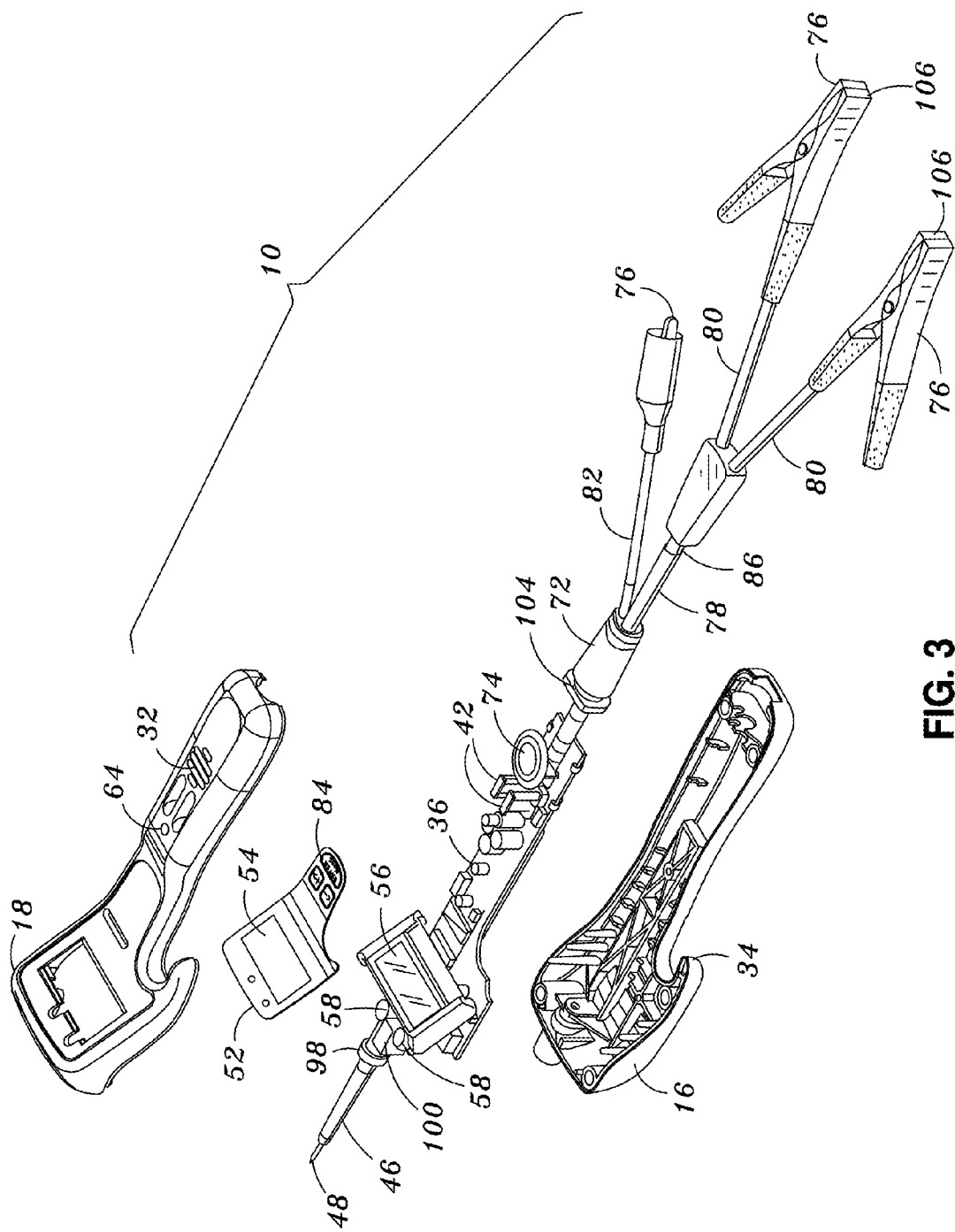
FIG. 3 is a partially exploded perspective illustration of the test device showing a circuit board assembly and having the power cable and the probe element extending out of the housing.

Referring now to FIGS. 2-5, shown is an embodiment of the electrical test device 10 schematically illustrated in FIG. 1. As best shown in FIGS. 2-3, the electrical test device 10 may include a housing 14 configured as a generally elongated, hollow, rectangular cross-sectional box. The housing 14 may have a top end 20 and a bottom end 22. The top end 20 may be generally wider than a remaining portion of the housing 14 so that a display assembly 52 containing the display device 54 may be incorporated into the housing 14. The display device 54 may be supported with display supports 44 which may orient the display device 54 at a convenient angle for observation by an operator of the test device 10. The remaining portion of the housing 14 may have a narrower width to allow for single-hand operation of the test device 10.

Contained within the housing 14 may be a circuit board assembly 36 comprising a circuit board 38 whereon the microprocessor 40 and the display device 54 along with the power supply 88, the microprocessor 40 reset control 94, the speaker driver 68, and the display driver 96 may be enclosed and interconnected. The housing 14 may include an upper shell 18 and a lower shell 16 which may be fastened to one another such as by mechanical fasteners. As can be seen in FIGS. 2 and 3, the housing 14 may include an upper wall 24 disposed with the upper shell 18 and a lower wall 26 disposed with the lower shell 16. In its assembled state, the housing 14 may include opposing side walls 28 and opposing end walls 30. At the top end 20 of the housing 14 may be an aperture formed therein and into which a probe jack 98 may be fitted. The probe element 50 may be configured to be removably inserted into the probe jack 98. A probe overmold 46 may be provided to encase a major portion of the probe element 50.

At the bottom end 22 of the housing 14 may be another aperture formed therein and through which a power cable 78 may protrude. The power cable 78 may be configured with a pair of power leads 80, preferably one positive lead and one negative lead. In addition, a ground lead 82 may be also included in the power cable 78 extending out of the bottom end 22 of the housing 14. Both power leads 80 may be configured as insulated conductors as may be the ground lead. The cable 50 may be encased in a cable sheathing 86 which passes through an annular shaped bushing 72 coaxially fitted within the aperture formed in the end wall 30 and which may prevent undue strain on the cable 50. The cable 50 may include a proximal end 104 which may be disposed adjacent the housing 14 aperture and the strain relief bushing 72. The cable 50 may also include a distal end 106 having a pair of high power alligator clips 76 disposed on extreme ends of each one of the power leads 80.

As was earlier mentioned, the external power source 90 may be configured as a motor vehicle battery (not shown) with the alligator clips 76 being configured to facilitate connection thereto. The alligator clips 76 may be color-coded wherein a negative one of the power leads 80 may be provided in a black-colored alligator clip 76 and the positive one of the power leads 80 may be provided with a red-colored alligator clip 76. Disposed at an end of the ground lead 82 may also be an alligator clip 76 to facilitate connection to a ground source. As can be seen in FIG. 2, the upper and lower shells 16, 18 of the housing 14 are configured to provide a hang loop 34 extending out of one of the side wall 28. The hang loop 34 may provide a mechanism by which the electrical test device 10 may be attached to or hung from fixed objects such as a cable or a hook.

As shown in FIG. 3, the power cable 78 may be electrically connected to the circuit board assembly 36. As was previously mentioned in the description of FIG. 1, the external power source 90 may be connected via the power cable 78 to a power supply 88 which may be integrated with the circuit board assembly 36 and which is ultimately connected to the probe element 50 extending out of the top end 20 of the housing 14. Included with the probe element 50 may be a probe tip 48 on an extreme end thereof. Advantageously, the probe element 50 may be configured to be removable from the electrical test device 10 via a probe jack 98 such that various electrical testing accessories may be plugged into the probe jack 98 for checking the electrical system 150 under test.

Figure 5:
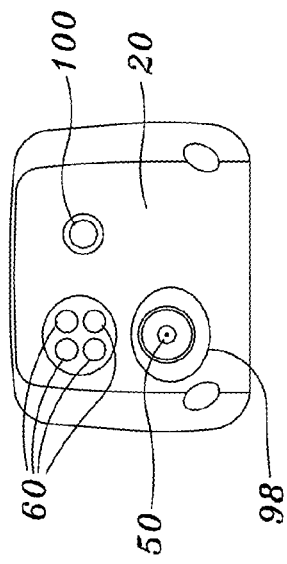
FIG. 5 is an end view of the electrical test device showing illuminating lamps and an auxiliary jack formed within the housing for receiving the auxiliary cable.

Referring now to FIG. 5, shown is a front view of the electrical test device 10 and illustrating openings or apertures formed within the housing 14 through which illumination lamps 60 may at least partially extend. The illumination lamps 60 may optionally be provided for illuminating an area adjacent to the test device 10. Although four apertures and illumination lamps 60 are shown, any number may be provided. It is contemplated that the illumination lamp 60 or lamps may be configured as light emitting diodes 64 (LEDs). Activation and deactivation of the illumination lamps 60 may be provided by means of the keypad 84 which may be electrically connected to the processor 92 or microprocessor 40 located on the circuit board 38 and which may be disposed at a location adjacent to the display device 54.

Figure 4:
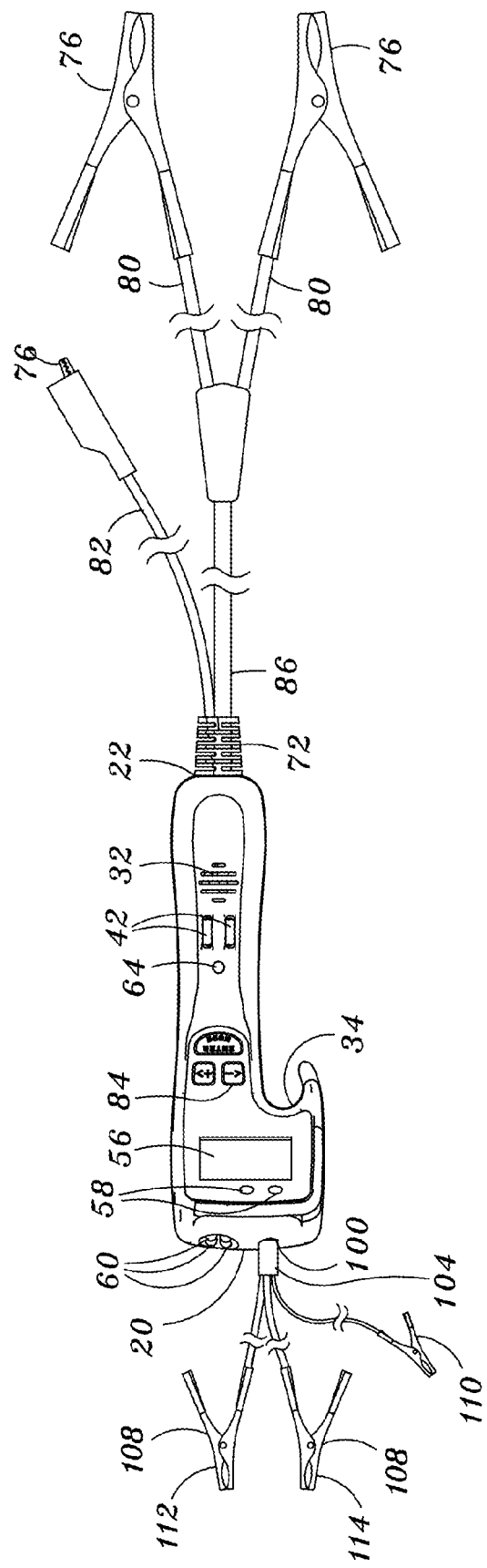
FIG. 4 is a top view illustration of the electrical test device showing an auxiliary cable that may be connectable to the electrical test device.

Also shown in FIGS. 4-5 is an auxiliary jack 100 into which an auxiliary cable 102 may be inserted for facilitating continuity measurements as was described above with regard to the dual continuity tester 118 functionality block. The auxiliary cable 102 has a proximal end 104 and a distal end 106 and may comprise a pair of auxiliary test leads 108 and the auxiliary ground lead 110. The auxiliary test leads 108 may comprise a first continuity test lead 112 and a second continuity test lead 114. In addition, the auxiliary cable 102 may include an auxiliary ground lead 110 for use as a continuity test common ground 116. The auxiliary jack 100 formed within the housing 14 may be electrically connected to the processor 92 or microprocessor 40. As was previously mentioned, the auxiliary ground and test leads 110, 108 may be adapted to be selectively insertable into the auxiliary jack 100 at the proximal end 104.

Referring to FIG. 3, mounted with the housing 14 may be the display device 54 which may be configured as a liquid crystal display 56 (LCD). In order to protect the display device 54 as well as the interior of the housing 14, a display overlay 12 may be included and is preferably disposed generally flush or level with an upper wall 24 of the housing 14. In addition, the display overlay 12 may extend along the upper shell 18 to form a protective barrier for the keypad 84 integrated into the electrical test device 10. As was earlier mentioned, the keypad 84 may allow for manipulation of the processor 92 or microprocessor 40 for controlling the functionality of the electrical test device 10. The keypad 84 may be comprised of any number of keys or buttons but preferably may include three (3) buttons for operation of the electrical test device 10. The three (3) buttons of the keypad 84 may be preferably configured to allow for selective switching between different measurement modes of the electrical test device 10.

In addition, the keypad 84 may allow for the measuring and displaying various parameters such as AC voltage and DC voltage measurements, resistance of an electrical circuit, current flowing within an electrical circuit, the frequency of signals, and any other parameter measured by any one of the test device 10 embodiments disclosed herein. In an embodiment, the electrical test device 10 may be manipulated such that parameters measurable by the electrical test device 10 include at least one of the following: circuit continuity, resistance, voltage, current, load impedance, and frequency, RPM, and pulse counting. In addition, further measurement modes may be facilitated through manipulation of the keypad 84. For example, frequency, RPM, duty cycle, and totalizer measurements may be extracted from an electrical system 150 under test. In addition, signal level and frequency may be measured as well as testing of impedance.

Referring still to FIG. 3, shown included with the circuit board assembly 36 may be at least one fuse 42 and preferably a pair of fuses 42 which partially protrude through apertures formed in the housing 14 at the upper shell 18. The fuses 42 may be incorporated into the electrical test device 10 as a safety precaution to prevent damage to the circuitry of the test device 10. Also included with the electrical test device 10 may be a circuit breaker 62 such as an electronic circuit breaker 62 which may also have configurable trip levels and a manual circuit breaker reset. Also shown incorporated into the circuit board assembly 36 of the electrical test device 10 is a piezo element 70 which is shown configured as a piezo disk 74 and which is disposed adjacent the bottom end 22 of the housing 14.

Speaker 66 holes 32 may be formed in the upper shell 18 of the housing 14 to allow for transmission of audible tones generated by the piezo disk 74 during operation of the electrical test device 10. Also included with the circuit board assembly 36 may be an additional lamp configured as an LED 64 and which may protrude through an aperture formed in the upper shell 18 of the housing 14 as shown in FIGS. 2 and 3. Such LED 64 may be connected to the processor 92 or microprocessor 40 and may provide a means to indicate whether power is being applied to the electrical test device 10. Alternatively, or in addition to, the LED 64 protruding through the upper shell 18 of the housing 14 may also be configured as a power-good indicator and may be de-activated to alert the user of a blown fuse 42.

Regarding the operation of the electrical test device 10, as was earlier discussed, the electrical test device 10 is operative in either one of a passive mode or an active mode. The passive mode is defined by measurements of parameters of an electrical system 150 with no power being supplied thereto by the probe element 50. The active mode is defined by measurement of parameters of the electrical system 150 during application of power such as from an external power source 90 through the probe element 50 and into the electrical system 150.

As was earlier discussed, the electrical test device 10 may be operated as a dual continuity tester 118 wherein the auxiliary cable 102 may be inserted into the auxiliary jack 100 at the top end 20 of the housing 14 as shown in FIG. 4. After insertion, the first continuity test lead 112 and second continuity test lead 114 as well as continuity test common ground 116 may be connected to the electrical system 150 under test. In the active mode, wherein power is supplied to the electrical system 150 under test, the continuity of a particular portion of the electrical system 150 may be verified by using the auxiliary cable 102 comprising the first continuity test lead 112 and/or the second continuity test lead 114 in combination with the continuity test common ground 116.

As shown in FIG. 3, a pair of signal lamps 58 may be included with the test device 10 and may be positioned at the top end 20 of the housing 14 so as to protrude through apertures formed in the upper shell 18. The signal lamps 58 may be configured as LEDs 64 and, more specifically, may be configured as a green LED and a red LED. In addition, as was previously mentioned, the piezo element 70 may be used in combination with or may be exclusively during continuity testing. Importantly, the dual continuity tester 118 may use the current source provided by the external power source 90 for inputting current into the electrical system 150 during continuity testing.

Load impedance detection 120 (FIG. 1) functionality may be facilitated such that the magnitude of a voltage drop within an electrical system 150 (FIG. 1) may be determined such as when testing electrical junctions in power feed circuits that may have loose or corroded connections. The electrical system 150 under test may be measured with differences therebetween being assessed and displayed on the display device 54 (FIG. 1). The logic probe generator and detector 122 functional block, as was previously discussed, allows for testing of high logic, low logic, and pulsing logic signals. The electrical test device 10 is configured to allow forcing of the input signal into the electrical system 150 under test with manipulation of multiple functions of the logic detection functionality such that an appropriate input signal may be injected into the electrical system 150 under test.

The frequency and totalizer measurement 124 (FIG. 1) functionality may allow for measuring signals from the electrical system 150 as well as providing the capability for entering a "divide ratio", which may be equivalent to the number of cylinders of an engine of the motor vehicle being tested. In this manner, the electrical test device 10 may measure the revolutionary speed at which a motor vehicle engine is operating. In addition, as was previously discussed, rates of voltage or current fluctuation may be measured and signal transition components of a wave form may be analyzed to extract frequency, duty cycle, and number of pulses. Regarding the voltage measurement 126 functionality, the electrical test device 10 may measure and display average voltage as well as measure and display positive peak voltage and negative peak voltage. Importantly, the measurement of negative peak voltage enhances the ability to analyze and measure voltage of an alternator having a faulty diode.

The electrical test device 10 may be operated as a digital volt meter for performing a voltage drop test and battery load test as well as transient voltage testing. In addition, the combination of the power output driver 128 with current measurement 130 (FIG. 1) capability may allow the electrical test device 10 to measure current and voltage simultaneously. The electrical test device 10 may be placed in the active mode wherein a button of the keypad 84 may be placed in a "latched" mode or permanent operation mode wherein a constant supply of power is provided into the electrical system 150 under test through the probe element 50. However, the electrical test device 10 can be placed in a "momentary" power mode wherein power may be supplied on an as-requested basis by to manual manipulation of one of the buttons of the keypad 84.

The processor 92 or microprocessor 40 may be configured to cause periodic energization of the probe element 50 for powering the electrical system 150 under test at predetermined intervals for testing an electro-mechanical device that is part of an electrical system 150 under test. Examples of electro-mechanical devices that may be tested in this manner include, but are not limited to, relay switches, solenoids, motors, and various other devices. Power may be provided to the electrical system 150 under test on an automatic intermittent basis at predetermined intervals such as, for example, at one-second intervals or at other intervals. Advantageously, the ability to provide power in such varying modes allows for testing the proper operation of electro-mechanical devices such as relay switches as well as tracing the locations of such electro-mechanical devices. By connecting the electrical test device 10 to the external power source 90 and intermittently providing current into the electrical system 150 through the probe element 50, a user may track the location of a faulty relay switch by listening for a clicking sound as power or current is intermittently applied to the electrical system 150 under test. Such method for checking for faulty relay switches may be especially valuable in detecting a relay switches that may be hidden underneath carpeting, seating, and/or plastic or metal molding commonly found in automotive interiors.

Referring still to FIG. 1, the electrical test device 10 disclosed herein is configured to monitor an electrical system 150 for arcing while simultaneously measuring one or more parameters of the electrical system 150 such as during the application of current to the electrical system 150. FIG. 1 graphically illustrates an arc 154 occurring between the electrical system 150 under test and a component 152 that is associated with the electrical system 150. In the test device 10, the spectral analyzer 134 block may cooperate with the power output driver with over current protection 128 block and the frequency and totalizer measurement 124 block to detect arcing in the electrical system 150. Furthermore, the above-noted functional blocks may be operative to halt the application of current or power to the electrical system 150 in the event that arcing is detected. The above-noted functional blocks may cooperate to measure the time-varying nature (i.e., time domain) and the frequency spectrum (i.e., frequency domain) of the parameters being measured. In this regard, the test device 10 may analyze the frequency spectrum of an output signal to determine whether arcing is occurring by distinguishing non-periodic signals 144 (i.e., arcing signals) from periodic signals 142 such as AC voltage, DC voltage, logic/data waveforms, and other signals which may have spectral energy that may be more contained in a low-frequency portion of the frequency spectrum of an output signal.

As indicated earlier, an arc 154 (FIG. 1) may be defined as an impulse of relatively short duration in the time domain and which may occur one or more times during the operation of an electrical system 150 depending upon operating conditions and other variables. In the frequency domain, arcing may be represented by an increase in energy in the broadband spectrum. The energy released during arcing may be detectable at relatively high frequencies within a frequency spectra (FIG. 7) of the output signal. It should be noted that an increase in energy may occur in the low-frequency portion (FIG. 7) of the frequency spectrum during application of current to the electrical system 150 which may be the result of arcing. However, the increase in energy in the low-frequency portion may also be the result of electrical noise within the electrical system 150. Therefore, the test device 10 disclosed herein may be configured to perform separate evaluations of the low-frequency portion and the high-frequency portion (FIG. 7) in order to reliably detect the occurrence of arcing within the electrical system 150.

Referring to FIG. 1, for the embodiment of the test device 10 configured to detect arcing, the spectral analyzer 134 may be connected to the probe element 50. The spectral analyzer 134 may also be connected to the processor 92 by one or more lines. The probe element 50 may also be connected to the power supply 88 which may be connected to an external power source 90 such as a battery of a motor vehicle. The probe element 50 may be placed in contact with the electrical system 150 and may be energized by the power supply 88 in order to apply to the electrical system 150 an input signal containing current for measuring at least one parameter of the electrical system 150 in a manner as described above. Upon application of current to the electrical system 150, the spectral analyzer 134 may monitor the electrical system 150 for arcing behavior in the presence of non-arcing signals. Advantageously, the spectral analyzer 134 may monitor the electrical system 150 for arcing while simultaneously measuring the parameters of the electrical system 150.

The test device 10 may include a suitable sensing element (not shown) which may be a passive or active device such as a resistor (not shown) or an inductor (not shown). The sensing element may sample or monitor output signals for possible arcing in response to the application of current to the electrical system 150 when the input signal is applied to the electrical system 150. The test device 10 may also include one or more configurations of signal processing such as a digital signal processor 92 for examining the periodicity and/or spectrum of the monitored output signal in order to determine whether the output signal contains arcing. As was earlier indicated, the occurrence of arcing may generate an increase in the broadband spectrum of the output signal, both in a low-frequency portion (FIG. 7) of the frequency spectra 140 and in a high-frequency portion (FIG. 7) of the frequency spectra 140. However, an increase in energy in a low-frequency portion of the frequency spectra 140 may be indicative of processes other than arcing such as electrical noise, and therefore may require an evaluation of the high-frequency portion of the spectrum in order to reliably determine the occurrence of arcing. In this regard, the spectral analyzer 134 may be configured to analyze a continuous spectra of low frequency and high frequency energy of the output signal. The spectral analyzer 134 may analyze the power spectra density of the output signal as may be measured in power (i.e., watts/Hz) (FIG. 7) or in terms of voltage (i.e., volts/Hz) (FIG. 7).

Figure 7:
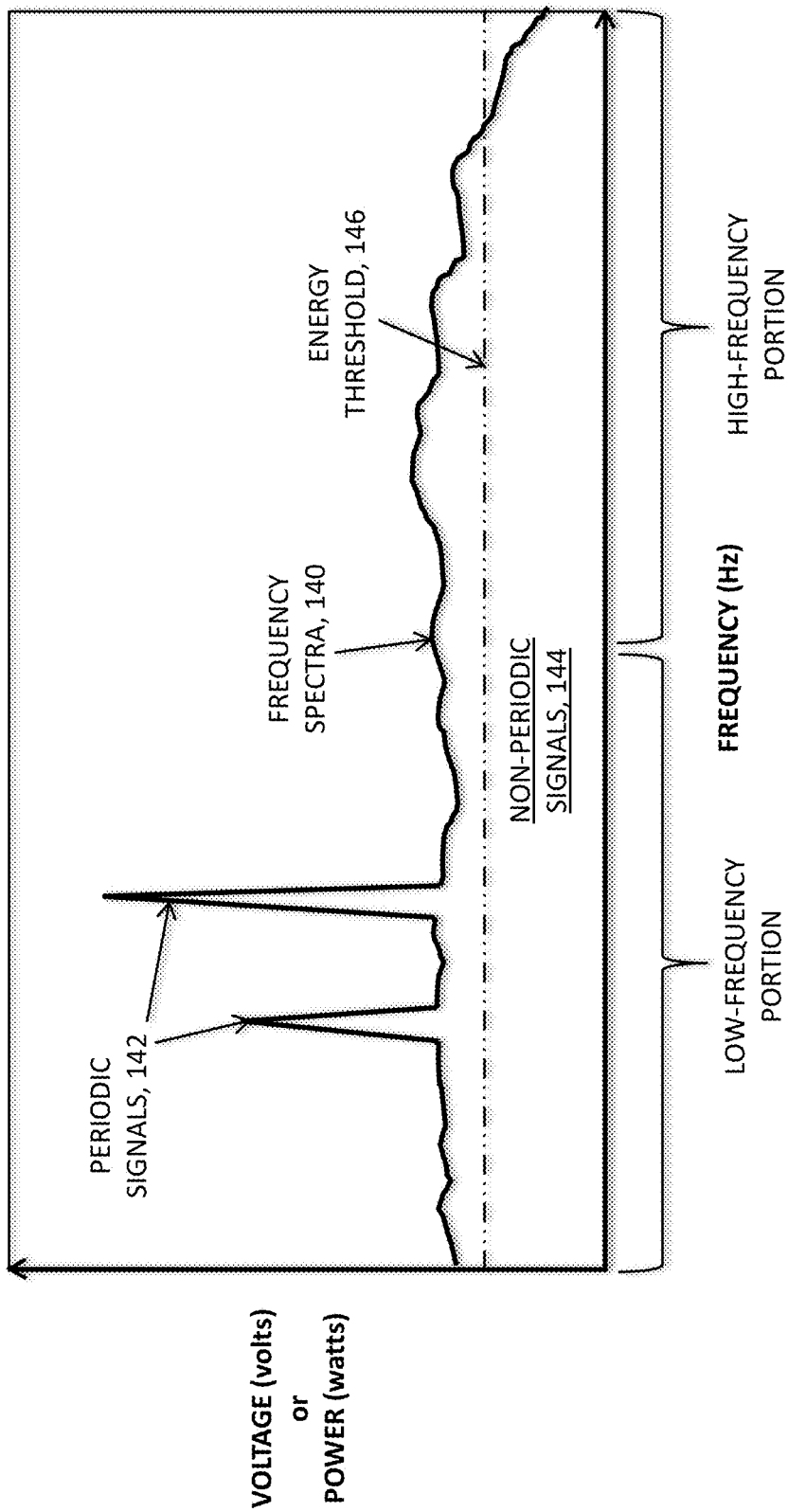
FIG. 7 is a of plot of the frequency spectra of an output signal in response to the application of current to an electrical system under test and illustrating a low-frequency portion and a high-frequency portion of the frequency spectra.

Referring briefly to FIG. 7, the frequency spectra 140 of the output signal may include the low-frequency portion and the high-frequency portion and may contain energy contributions from periodic signals 142 (e.g., discrete signals) and energy contributions from non-periodic signals 144. The low-frequency portion of the frequency spectra 140 may contain a substantial majority of the periodic signals 142 in the frequency spectra 140 relative to the quantity of the periodic signals 142 that may be contained in the high-frequency portion. Conversely, the high-frequency portion of the frequency spectra 140 may contain a substantial majority of the non-periodic signals 144 relative to the quantity of non-periodic signals 144 contained in the low-frequency portion. In this regard, the low-frequency portion may be defined as the location where most of the known, periodic signals 142 reside and the location where the test device 10 is making measurements of voltage, current, and other parameters of the electrical system 150 under test. The high-frequency portion of the frequency spectra 140 may comprise the band of frequencies where a substantial portion of arcing power may be contained with relatively few periodic signals 142. For example, FIG. 9 illustrates two periodic signals 142 in the low-frequency portion of the frequency spectra 140 with no discernable periodic signals 142 occurring in the high-frequency portions.

The spectral analyzer 134 block of FIG. 1 may be configured to analyze the spectral density of the low-frequency portion and detect, discern, or distinguish periodic signals 142 from non-periodic signals 144. In this regard, the spectral analyzer 134 block may be configured to detect the potential occurrence of arcing in the electrical system 150 under test when the energy contributed by the non-periodic signals 144 in the low-frequency portion exceeds an energy threshold that may be predetermined and/or preprogrammed into the test device 10. As indicated above, such periodic signals 142 may represent one or more of the parameters (i.e., voltage, current, etc.) being measured by the test device 10 during application of current to the electrical system 150. If the energy in the low-frequency portion exceeds the predetermined energy threshold, the spectral analyzer 134 may then analyze the spectral density of the high-frequency portion. The spectral analyzer 134 may reliably detect the occurrence of arcing when the energy in the high-frequency portion exceeds the predetermined energy threshold.

In an embodiment, the predetermined energy threshold may be the same for the low-frequency portion and the high-frequency portion. However, the energy threshold for the low-frequency portion may be different than the energy threshold of the high-frequency portion. The spectral analyzer 134 may be configured to analyze the high-frequency portion for arcing using the high frequency energy threshold after the spectral analyzer 134 detects the potential occurrence of arcing during analysis of the low-frequency portion using the low frequency energy threshold. In this manner, the test device 10 may be operated with a reduced sensitivity during the initial analysis of the low-frequency portion of the frequency spectra 140. Such reduced sensitivity of the test device 10 may reduce the occurrence of a false positive or false alarm in detecting the potential occurrence of arcing when analyzing the low-frequency portion.

The selection of the energy threshold may be based on historical data regarding the magnitudes of arcing energy emitted by one or more electrical circuit systems such as automotive circuits tested under one or more operating or testing conditions. Furthermore, the energy threshold may be based upon the minimum sensitivity of the test device 10. As indicated above, if the energy threshold is set too low, very weak levels of arcing may be detected which may create a large number of false positives which may interrupt the overall test sequence that the technician is performing when testing multiple locations of an electrical system 150 or when testing multiple electrical systems 150. Ideally, the predetermined energy threshold is selected to provide a substantially reliable indication of arcing in a substantial majority of electrical circuits that may be tested using the test device 10. For example, the energy threshold, which may be different for the low-frequency portion relative to the energy threshold of the high-frequency portion, may be selected to provide a probability of greater than approximately 80 percent that arcing is present in when the increase in broadband energy of the frequency spectra 140 exceeds the energy threshold. In this regard, the test device 10 may provide the ability to adjust the energy threshold for different electrical system 150 such that the energy threshold is compatible with the electrical systems 150 to be tested.

In an embodiment, the spectral analyzer 134 (FIG. 1) may detect the presence of arcing by first determining the total spectral power or the sum of arcing and non-arcing signals (i.e., respectably, non-periodic and periodic signals 142) contained within the frequency spectra 140 of the output signal. The output signal may be in the form of a voltage signal, a power signal, or other suitable signal for analysis by the spectral analyzer 134. In this regard, the total spectral power may be measured in terms of power (e.g., watts/Hz) or in terms of voltage (e.g., volts/Hz) or in other terms. The spectral analyzer 134 may then determine the contribution of the periodic signals 142 to the total spectral power. The periodic signals 142 may be identified and measured by the existing functional blocks of the test device 10 as described above. For example, periodic signal 142 power may be a measured parameter (i.e., voltage, frequency) of the electrical system 150 in response to application of the current to the electrical system 150. The spectral analyzer 134 may then determine the contribution of the non-periodic signals 144 as the difference between the total spectral power and the contribution of the periodic signals 142.

The spectral analyzer 134 may determine the increase in the broadband energy of the frequency spectra 140 by comparing the contribution of the non-periodic signals 144 to the total spectral power. The spectral analyzer 134 may then determine whether the increase in the broadband energy exceeds a detection sensitivity of the test device 10. If the sensitivity of the test device 10 is not exceeded, the spectral analyzer 134 may compare the increase in the broadband energy to the predetermined energy threshold and may transmit a signal to an indicating device such as to the display device 54 or to the speakers 66 to indicate when the increase in broadband energy exceeds the energy threshold. The processor 92 may be coupled to the spectral analyzer 134 and may be configured to halt the application of current to the electrical system 150 when the energy of a high-frequency portion exceeds the predetermined energy threshold as a means to avoid damage to the electrical system 150 or to other components that may be arcing with the electrical system 150.

As indicated earlier, the spectral analyzer 134 block (FIG. 1) may be equipped with spectral analysis circuitry such as digital signal processing software that can analyze the output signal in the frequency domain and/or the time domain and measure the broadband low frequency and high-frequency portions of energy present within the output signal and which may indicate the presence of arcing. The spectral analyzer 134 block may employ a Fourier Transform or other suitable technique to obtain a spectral portrait of the output signal and facilitate discernment of the contents of the low-frequency portion and the high-frequency portion of the frequency spectra 140 as shown in FIG. 7. The results of the arcing test may be displayed on the display device 54 and/or may be indicated by the speaker 66 to alert the technician of the occurrence of arcing. In this regard, the spectral analyzer 134 block may be configured to digitally process the output signal and analyze in the frequency domain and/or the time domain the output signal for detection of arcing during application of current to the electrical system 150. The testing of an electrical system 150 for arcing may occur continuously during measurement of the various parameters as current is applied to the electrical system 150. Alternatively, the electrical system 150 may also be tested for arcing on an intermittent basis or on a preprogrammed basis.

Figure 6:
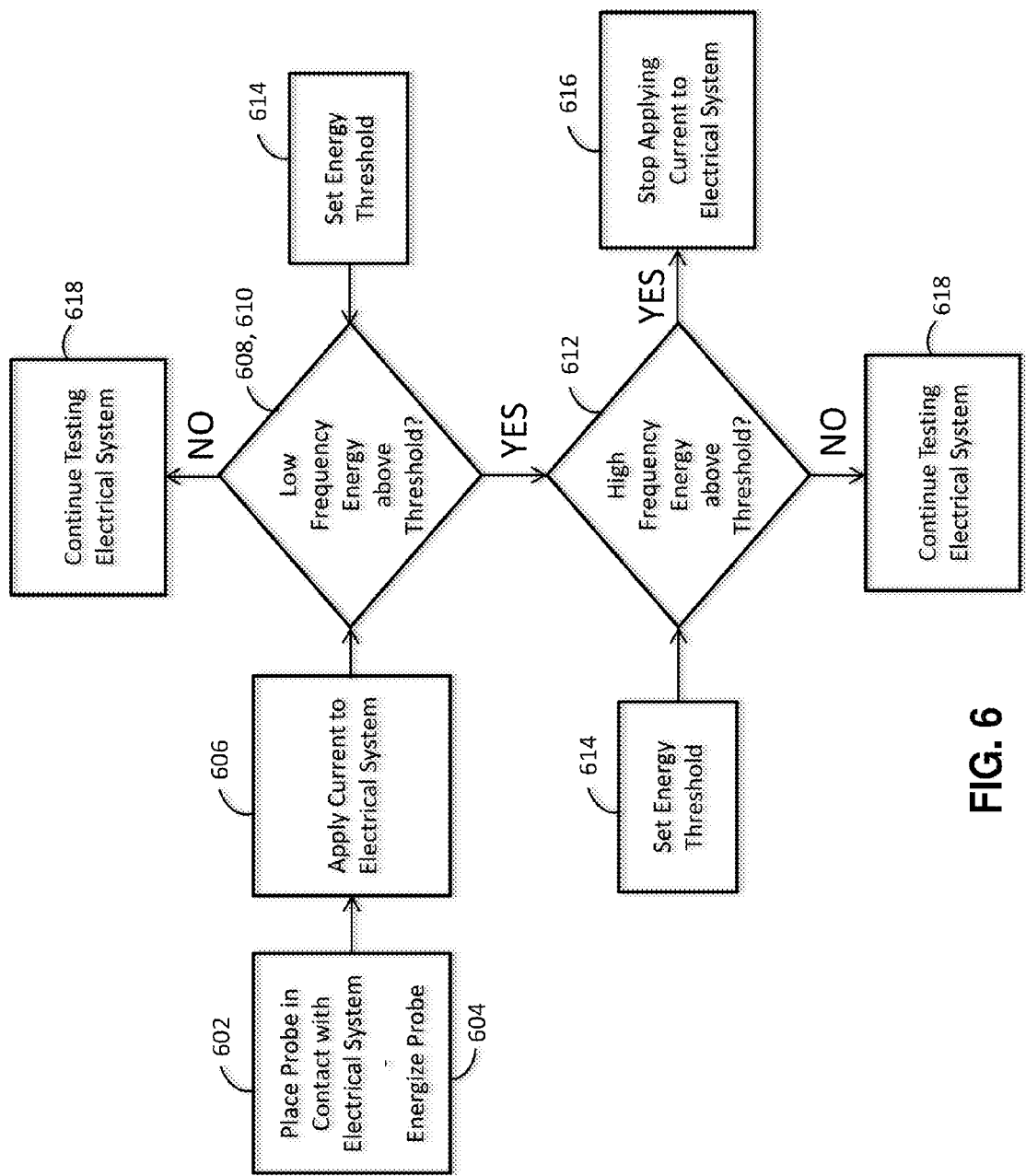
FIG. 6 is a flow diagram including one or more operations that may be included in a method for detecting the presence of arcing in an electrical system.

Referring to FIG. 6, shown is a flow chart including one or more operations that may be performed during a method of detecting arcing in an electrical system 150. In step 602, the conductive probe element 50 (FIG. 1) may be placed in contact with the electrical system 150 under test as shown in FIG. 1. Power may be provided to the probe element 50 from a power source such as an external power source 90 such as the battery of a motor vehicle.

Step 606 of the method of FIG. 6 may comprise applying an input signal to the electrical system 150 (FIG. 1) using the conductive probe element 50 (FIG. 1). The input signal may contain current to facilitate the measurement of one or more parameters of the electrical system 150 as was discussed above. The parameters may include circuit continuity, resistance, voltage, current, impedance, and other parameters.

Step 608 may comprise receiving an output signal from the electrical system 150 (FIG. 1) at the spectral analyzer 134 (FIG. 1). The output signal may be received in response to application of the input signal to the electrical system 150. The output signal may be in the form of a voltage signal, a power signal, or other signal form. Step 608 may further comprise analyzing, using the spectral analyzer 134, the frequency spectra 140 (FIG. 7) of the output signal which may include a low-frequency portion (FIG. 7) and a high-frequency portion (FIG. 7). As illustrated in FIG. 7, the frequency spectra 140 may contain energy contributed by periodic signals 142 and non-periodic signals 144 as discussed above.

Step 610 may comprise analyzing, using the spectral analyzer 134 (FIG. 1), the low-frequency portion (FIG. 7), and detecting one or more periodic signals 142 (FIG. 7) among the non-periodic signals 144 (FIG. 7) in the frequency spectra 140 (FIG. 7). The spectral analyzer 134 may be configured to detect the potential occurrence of arcing in the electrical system 150 when the energy contributed by the non-periodic signals 144 in the low-frequency portion exceeds a predetermined energy threshold as illustrated in FIG. 7. The predetermined energy threshold may be programmed into the test device 10 as was indicated above to account for the sensitivity of the test device 10 and prevent false positives or false alarms during the sequential testing of a number or parameters of the electrical system 150 under test. In this regard, if the energy in the low-frequency portion exceeds the energy threshold in step 610, then the spectral analyzer 134 block analyzes the high-frequency portion.

In step 612, the spectral analyzer 134 (FIG. 1) may compare the energy in the high-frequency portion (FIG. 7) to a predetermined energy threshold which may be different than the energy threshold of the low-frequency portion (FIG. 7). In step 614, the energy threshold in the high-frequency portion may be set or programmed into the test device 10 in a manner to provide reliable detection of arcing as discussed above.

In step 616, the application of current to the electrical system 150 may be halted when the energy of the high-frequency portion exceeds the predetermined energy threshold which may be indicative of arcing in the electrical system 150 under test. In this manner, the test device 10 prevents damage that may otherwise occur to the electrical system 150 if current were continuously applied to the electrical system 150 under test.

In step 618, if the energy in the high-frequency portion is less than the predetermined energy threshold, application of current to the electrical system 150 may allow for continuing measurement of one or more parameters of the electrical system 150. Such parameters that may be measured by the test device 10 may include, but are not limited to, circuit continuity, resistance, voltage, current, impedance, and frequency. In addition, the test device 10 may be configured to provide a signal to an indicating device such as a display device 54 or a speaker 66 to indicate to a user the occurrence of arcing in the electrical system 150. As discussed above, the test device 10 may be configured such that the magnitude of the energy threshold may be set to prevent false alarms of the detection of arcing.

Figure 8:
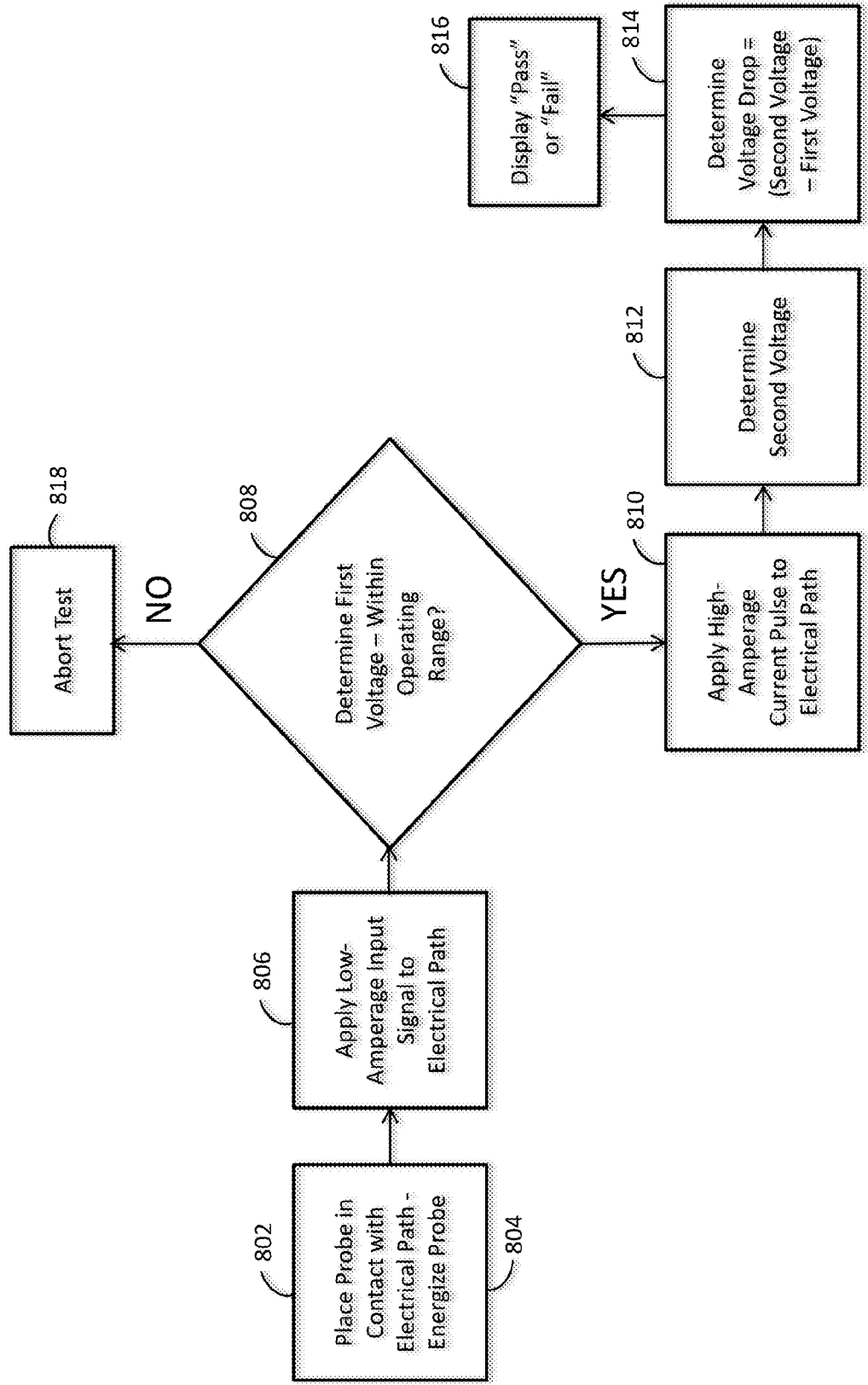
FIG. 8 is a flow diagram having one or more operations that may be included in a method of detecting a voltage drop in an electrical path of an electrical system.
Figure 9B:
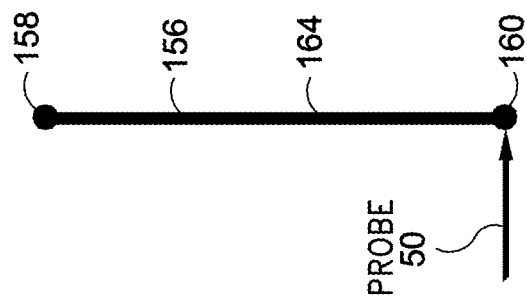
FIG. 9B is an illustration of an electrical path configured as a power feed and illustrating the probe element placed in contact with the low-voltage side for testing of the voltage drop.
Figure 9A:
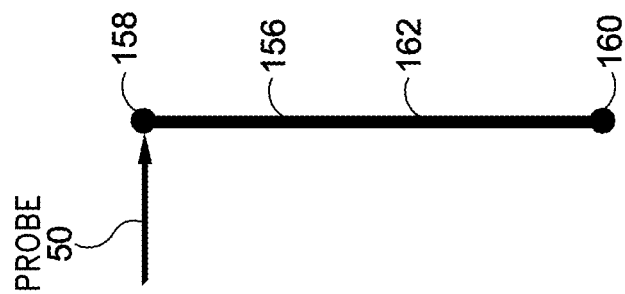
FIG. 9A is an illustration of an electrical path configured as a power ground having a high-voltage side and a low-voltage side and illustrating the probe element placed in contact with the high-voltage side for testing of the voltage drop.

Referring to FIGS. 1 and 8, in a further embodiment, the test device 10 may be configured to measure the health or integrity of relatively low-impedance cables or electrical paths 156 (FIGS. 9A-9B). The measurement of low-impedance electrical paths 156 such as power feeds 164 or power grounds 162 may be performed with the cooperation of the voltage measurement A/D converter 126, the current measurement A/D converter 130, and optionally, the auxiliary ground lead 110. The voltage measurement A/D converter 126 and the current measurement A/D converter 130 may be operated in cooperation with the processor 92. The measurement of low-impedance electrical paths 156 may be facilitated by first applying a relatively low-amperage input signal to the electrical path 156 and determining a first voltage. A relatively high-amperage current pulse may then be applied to the electrical path 156 to determine a second voltage. A voltage drop may be determined based on the difference between the first voltage and the second voltage. The test device 10 may then calculate the electrical resistance of the electrical path 156 based on the voltage drop and display the value of the voltage drop and/or provide a pass/fail indication regarding the health of the electrical path.

In the embodiment of the test device 10 (FIG. 1) for measuring the health of low-impedance electrical paths 156 (FIGS. 9A-9B), the test device 10 may include the power supply 88 (FIG. 1) and the probe element 50 (FIG. 1). The power supply 88 may be connected to the external power source 90 (FIG. 1). The probe element 50 may be placed in contact with the electrical path 156 and energized by power from the power supply 88 such that a relatively low-amperage input signal is applied to the electrical path 156. The processor 92 (FIG. 1) or other functional blocks discussed above may be connected to the probe element 50 and may be configured to receive an output signal from the electrical path 156 in order to determine the first voltage measurement across the electrical path 156 in response to application of the low-amperage input signal.

The processor 92 may then be configured to apply the relatively high-amperage current pulse to the electrical path 156 for a relatively short time period in order to determine a second voltage measurement across electrical path 156 in response to application of the high-amperage current pulse. The processor 92 may then determine the difference between the first voltage and the second voltage in order to determine a voltage drop across the electrical path 156. The test device 10 may include an indicating device such as a display device 54 or speaker 66 that may be coupled to the processor 92 to provide an indication of the voltage drop and the electrical resistance of the electrical path 156. As indicated above, the test device 10 may also be configured to provide a pass/fail indication of whether the voltage drop exceeds a maximum specified voltage drop for the electrical path 156. In addition, the test device 10 may provide an indication regarding whether the measurement of the current in the electrical path 156 is less than magnitude of the high-amperage current pulse applied to the electrical path 156. The indication may in the form of an audible indication, a visual indication, or a tactile (i.e., vibration) indication, or any combination thereof. During measurement of the second voltage, if the measured current in the electrical path 156 is less than the high-amperage current pulse, the auxiliary ground lead 110 may be connected from the test device 10 to the electrical path 156 to provide additional current to the electrical path 156.

The processor 92 (FIG. 1) and the test device 10 (FIG. 1) may be configured to halt or prevent the application of the high-amperage current pulse to the electrical path 156 when the first voltage falls outside of a predetermined or preset (e.g., normal) operating range of the electrical path 156. In this regard, during application of the low-amperage input signal, the test device 10 may be configured to monitor the electrical path 156 to determine whether the electrical path 156 has any obvious faults and is durable enough to receive the high-amperage current pulse. For example, the electrical path 156 may comprise a cable such as the power cable extending from a battery (not shown) of a motor vehicle (not shown) to a starter (not shown) of an engine (not shown) of the motor vehicle. If the application of the relatively low-amperage input signal to the electrical path 156 results in the first voltage being outside of the normal operating range for the power cable, then the cable may have an obvious fault and may not be durable enough to receive the high-amperage current pulse. In this example, the test of the electrical path 156 may be aborted in order to safeguard the electrical system 150 from damage and avoid the risk of damage to any electrical circuits that may be connected to the electrical path 156.

The magnitude of the high-amperage current pulse applied to the electrical path 156 may be preprogrammed into the test device 10 and/or may be manually adjustable. The magnitude of the high-amperage current pulse may be dependent upon the capacity of the electrical path 156. In an embodiment, the high-amperage current pulse may have an amperage of at least approximately 10 amps, However, depending upon the operation and construction of the electrical path 156 or cable, the high-amperage current pulse may have an amperage of up to 100 amps or more. The duration or length of time during which the high-amperage current pulse is applied to the electrical path 156 may be relatively short to avoid damage to the electrical path 156 or to components that may be connected to the electrical path 156. In a non-limiting example, the high-amperage current pulse may be applied to the electrical path 156 for a duration of less than approximately 5 milliseconds. However, longer or shorter durations for application of the high-amperage current pulse are possible. Advantageously, the test device 10 allows for testing the health and integrity of relatively low-impedance electrical paths or cables by contacting the probe element 50 to a single location on the electrical path 156 instead of applying test devices 10 on opposite ends of the electrical path 156.

Referring to FIGS. 9A-9B, the test device 10 may be configured to test an electrical path 156 functioning as a power ground 162 (FIG. 9A) or as a power feed (FIG. 9B). In testing the integrity of a power ground 162 (FIG. 9B), the probe element 50 may be placed in contact with a high-voltage side 158 of the power ground 162 and may source current into the power ground 162 in response to application of the relatively high-amperage current pulse. The test device 10 (FIG. 1) may also be adapted to test an electrical path 156 functioning as a power feed 164 (FIG. 9B) wherein the probe element 50 may be placed in contact with a low-voltage side 160 of the power feed 164. The probe element 50 may be configured to sink current from the power feed 164 into the test device 10 using a load resistance (not shown) that may be integrated into the test device 10. The probe element 50 may sink current from the power feed 164 into the test device 10 during application of the relatively high-amperage current pulse. In each case of FIGS. 9A and 9B, the processor 92 may determine a second voltage across the electrical path 156 in response to application of the relatively high-amperage current pulse.

In the case of the power ground 162 (FIG. 9B) or power feed 164 (FIG. 9B), the processor 92 may determine a voltage drop across the electrical path 156 based on the difference between the first voltage (i.e., measured during application of the low-amperage input signal) and the second voltage (i.e., measured during application of the high-amperage current pulse). The test device 10 may be configured to determine an electrical resistance of the electrical path 156 proportional to the voltage drop across the power feed 164 or power ground 162. The test device 10 may be configured to provide an indication of whether the electrical resistance of the power feed 164 or power ground 162 falls within the normal operating range. If a failure is detected in the power feed 164 or power ground 162 electrical paths 156 (i.e., electric resistances are below the normal operating range), the test device 10 may be configured to display or otherwise indicate such failure. In this regard, the voltage measurement A/D converter 126 and the current measurement A/D converter 130 may respectively collect voltage and current readings from the electrical path 156 and send such readings to the processor 92. The processor 92 may take such readings or data and compute the electrical resistance for the electrical path 156 under test and send a pass/fail result to the display device 54. As indicated above, a failure may be detected and displayed if a voltage drop exceeds a maximum voltage drop expected for the electrical path 156. A failure may also be detected and displayed if the current flow within the electrical path 156 is below the level that the test device 10 may apply to the electrical path 156 with the relatively high-amperage current pulse.

Referring to FIG. 8, shown is a method for measuring a voltage drop and/or electrical resistance in a relatively low-impedance electrical path 156 (FIG. 9A-9B). Step 802 of the method of FIG. 8 may include placing the conductive probe element 50 in contact with the electrical path 156. Step 804 may comprise energizing the probe element 50 such as by using power from a power supply 88. Step 806 of the method of FIG. 8 may include applying, using the probe element 50, a relatively low-amperage input signal to the electrical path 156. Step 808 of the method of FIG. 8 may comprise determining, using the processor 92, a first voltage across the electrical path 156 in response to the application of a low-amperage input signal. Step 808 may include determining whether the first voltage within the electrical path 156 resulting from application of the low-amperage input signal is within a normal operating range of the electrical path 156. Once the first voltage has been determined to be within the normal operating range of the electrical path 156, step 810 may comprise, using the probe element 50, a relatively high-amperage current pulse to the electrical path 156. In this regard, a technician may depress a button on the keypad which may then display a ready indication on the display device 54. The technician may then push the appropriate button on the keypad to initiate application of the momentary high-amperage current pulse to the probe element 50 and into the electrical path 156 under test. The current in the high-amperage current pulse may be supplied by the power output driver with over current protection 128.

Step 812 may comprise determining, using the processor 92 and one or more of the functioning blocks illustrated in FIG. 1, the second voltage across the electrical path 156 in response to application of the high-amperage current pulse. Voltage and current readings may be collected by respective ones of the voltage measurement A/D converter 126 and current measurement A/D converter 130 and sent to the processor 92.

Step 814 may comprise determining, using the processor 92, a voltage drop across the electrical path 156 based upon the difference between the first voltage and the second voltage. The method of FIG. 8 may include, indicating using an indicating device, the voltage drop, and/or electrical resistance across the electrical path 156 based upon (i.e., proportional to) the voltage drop. Step 816 of FIG. 8 may comprise providing a pass/fail indication of whether the voltage drop exceeds the maximum specified voltage drop for the electrical path 156. A pass/fail indication may also be provided if the measurement of current in the electrical path 156 is less than the magnitude of the high-amperage current pulse.

Step 818 of the method of FIG. 8 may include preventing the application of high-amperage current pulse to the electrical path 156 when the first voltage is outside of the normal operating range for the electrical path 156. In this regard, step 818 may comprise aborting the test for the integrity of low-impedance electrical path 156 in order to avoid the risk of damage to the electrical path 156 or any circuits that may be connected to the electrical path 156 that may otherwise be caused by application of the high-amperage current pulse.

Referring again briefly to FIGS. 9A and 9B, the method of testing the integrity or health of an electrical path 156 may also comprise testing a power feed 164 or a power ground 162. As shown in FIGS. 9A and 9B, the electrical path 156 may have a high-voltage side 158 and a low-voltage side 160. For testing a power ground 162, the probe element 50 may be placed in contact with the high-voltage side 158. In FIG. 9A, the method may include applying the relatively low-amperage input signal to the electrical path 156 at the high-voltage side 158 of the power ground 162. If the first voltage measured by the test device 10 falls within the normal operating range for the electrical path 156, then the relatively high-amperage current pulse may be sunk into the test device 10 by means of a load resistance that may be incorporated into the test device 10. The processor 92 may determine a second voltage of the electrical path 156 in response to application of the high-amperage current pulse and may calculate the voltage drop and/or the electrical resistance of the power ground 162 electrical path 156 based upon the difference between the first voltage and the second voltage.

In FIG. 9B, for electrical paths 156 functioning as power feeds 164, the probe element 50 may be placed into contact with the low-voltage side 160 of the electrical path 156. The relatively low-amperage input signal may be applied to the electrical path 156 at the low-voltage side 160 of the power feed 164 and a first voltage may be determined. If the first voltage measured by the test device 10 falls within the normal operating range for the electrical path 156, then the high-amperage current pulse may be sourced into the electrical path 156 from the test device 10. The second voltage may be then determined and compared to the first voltage to arrive at the voltage drop across the power ground 162 electrical path 156. Electrical resistance may also be determined and compared to the specified resistance for the electrical path 156 to determine the integrity of the electrical path 156.

Advantageously, in testing relatively low-impedance electrical paths 156 of cables using the test device 10 and method described above in the examples shown in FIGS. 9A and 9B, a user may safely evaluate the integrity of the electrical path 156 or cable without disconnecting or removing the electrical path 156 from the electrical system 150. The high-amperage current pulse is advantageously applied over a relatively short time period to avoid damage to the electrical path 156. However, the high-amperage current pulse is applied for a long enough duration to acquire the second voltage measurement that may be used to determine the voltage drop across the electrical path 156 and provide an accurate assessment of the electrical resistance of the electrical path 156.

In any one of the above-described embodiments of this device, measurement of any one of the parameters such as voltage, resistance, frequency, DC voltage, DC current, and AC voltage, may be performed in a sequential manner without user intervention and without manual selection of the parameter to be measured. In this manner, sequential measurement of one or more parameters may free up one or both hand of a user to allow the efficient testing of various portions of a diagnostic sequence. In this regard, the test device 10 as disclosed here may facilitate automatic scanning of a multiplicity of parameters of an electrical system 150 under test and automatically select the parameter to be tested and displayed. In an embodiment, the test device 10 may be configured such that more than one parameter may be displayed in a sequence after measuring a plurality of parameters.

Figure 10:
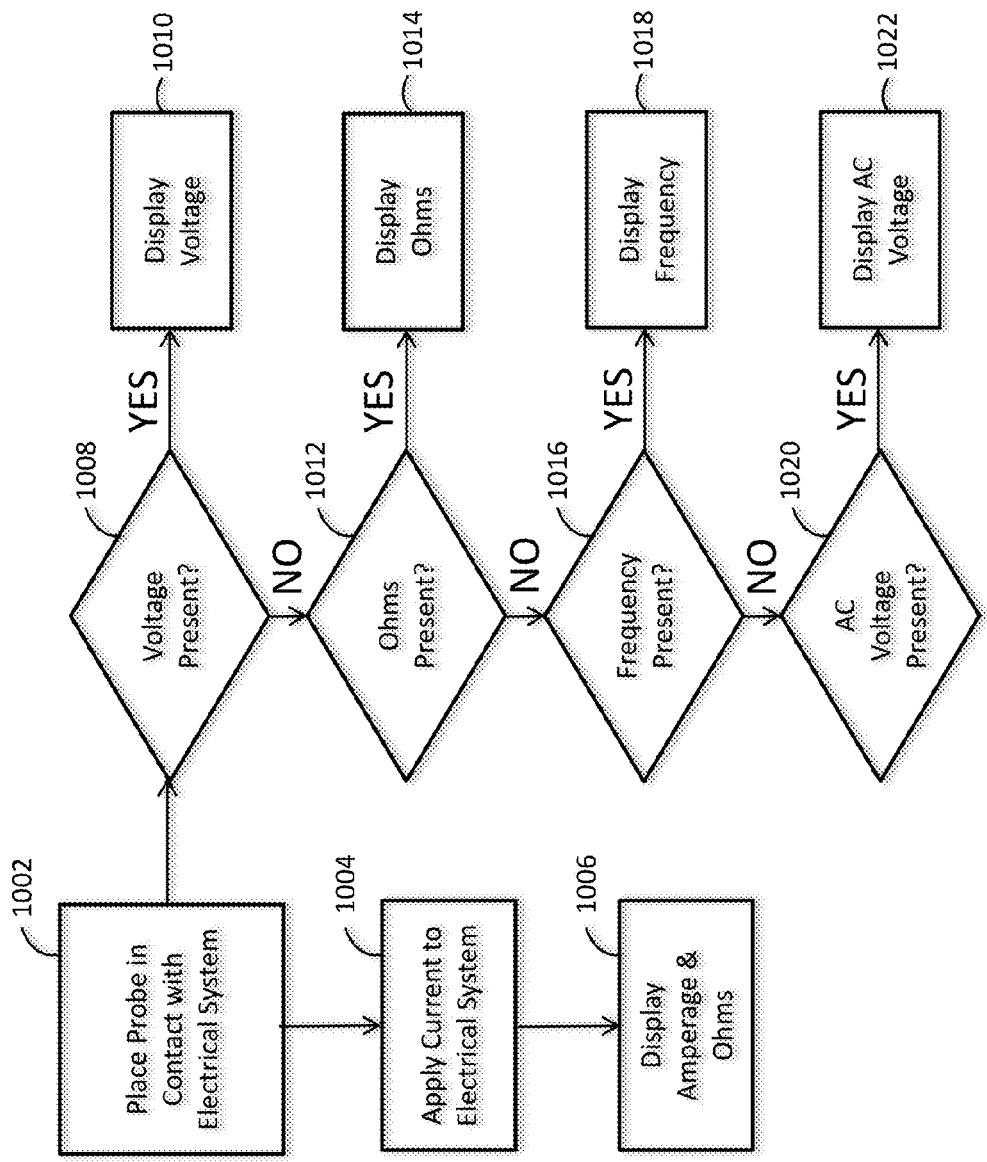
FIG. 10 is a flow chart illustrating one or more operations that may be automatically performed during measurement one or more parameters of an electrical system under test.

Referring now to FIGS. 1 and 10, any of the embodiments of the test device 10 disclosed herein may include the capability to sequentially measure a variety of parameters of an electrical system 150 under test without user invention. The test device 10 may facilitate automatic sequential measurement of the parameters with the cooperation of the load impedance detector 120 block, the frequency and totalizer measurement 124 block, the voltage measurement A/D converter 126 block, the resistance measurement 132 block, and the processor 92. The keypad of the test device 10 may include one or more buttons or switches which may be activated to initiate the automatic sequencing of the measuring of various parameters.

The flow chart in FIG. 10 illustrates one or more operations that may be performed during sequential measurement of one or more parameters of an electrical system 150 under test. In step 1002, the probe element 50 may be placed in contact with the electrical system 150 under test. After placing the probe element 50 in contact with the electrical system 150, in step 1004, current may be applied to the electrical system 150 by activating a switch or button on the keypad. In step 1006, the test device 10 may measure the current (e.g., in terms of amperage) and/or resistance (e.g., in terms of ohms) in the electrical system 150 in response to application of the input signal. The display device 54 may display a reading of the amperage and/or a reading of the ohms measured during application of the input signal to the electrical system 150.

In step 1008, the test device 10 may initiate automatic measurement of one or more parameters of the electrical system 150 without accessing the keypad to select a parameter to be measured. During such automatic sequential measurement, the functional blocks for low-impedance detection 120, frequency measurement 124, voltage measurement 126, and resistance measurement 132 (FIG. 1) may be coordinated by the processor 92 to sequence the test device 10 in a logical manner to prevent damage to the electrical system 150 and to the test device 10. The display device 54 and/or the speaker 66 may be used to provide an indication of the measurement of such parameters such as an audible signal or a visual indication of measured parameters.

The test device 10 may be configured to begin measurement of the most dominating parameter or the parameter which prevents other parameters from being measured. For example, voltage of the electrical system 150 may be the initial parameter measured. If a voltage reading is detected and measured, the voltage measurement may be displayed and/or stored in the test device 10 in step 1010. The next most sensitive measurement may then be measured such as, for example, a measurement of resistance in step 1012 (FIG. 10) using the resistance measurement 132 block illustrated in FIG. 1. The resistance measurement may be displayed by a display device 54 in step 1014. The test device 10 may be configured to insert or apply an input signal of current to the electrical system 150 via the probe element 50 to provide the capability for measuring the electrical resistance.

Step 1016 may comprise measuring a frequency of the electrical system 150 in response to application of the input signal containing current. Upon measurement of the frequency, step 1018 may comprise displaying the frequency on the display device 54 or providing an audible indication of the measurement of the frequency such as through the speakers 66. Step 1020 may comprise detecting the presence of an AC voltage in an electrical system 150. Detection and measurement of the AC voltage in an electrical system 150, step 1022 may comprise displaying the measurement of the AC voltage such as on the display device 54. As may be appreciated, the sequential measurement of the parameters may include a variety of other parameters not described above and/or not illustrated in FIG. 10.

By proceeding in a manner described above and illustrated in FIG. 10, the processor 92 and/or test device 10 may coordinate the measurement of one or more parameters of the electrical system 150 in an automatic and/or pre-defined sequence. The display device 54 and/or speaker 66 may be used to notify the user of stored data. An alert may be sounded by the speaker 66 when all parameters have been measured and to notify the user of the conclusion of all possible measurements at the particular node in the electrical system 150. In this manner, the technician may efficiently move the probe element 50 to a different position on the electrical system 150 or to another electrical system 150 for initiating another sequence of automatic measurements. In an embodiment, the speaker 66 may be configured to provide audible feedback to the user regarding which parameter is being measured and avoiding the need for the user to constantly view the display to determine which parameter is being measured. Optionally, at any point during the testing sequence, the test device 10 may be moved into a manual mode wherein the user may manually select which parameters are to be measured. For example, a user may halt the automatic sequencing of the measurement of parameters by manipulating the keypad and entering a manually controlled and more focused sequence for measuring one or more particular parameters of interest.

Additional modifications and improvements of the present disclosure may be apparent to those of ordinary skill in the art. Thus, the particular combination of parts described and illustrated herein is intended to represent only certain embodiments of the present disclosure and is not intended to serve as limitations of alternative embodiments or devices within the spirit and scope of the disclosure.

What is claimed is:

1. An electrical test device, comprising:
a power supply connected to an external power source;
a single conductive probe element configured to be placed in contact with an electrical path of an electrical system and energized by the power supply for applying to the electrical path a current of relatively low-amperage; and
a processor connected to the probe element and being configured to receive an output signal from the electrical path and determine a first voltage across the electrical path in response to the low-amperage current;
the single conductive probe element being configured to apply a relatively high-amperage current pulse to the electrical path, the processor being configured to determine a second voltage across the electrical path in response to application of the high-amperage current pulse, the high-amperage current pulse being of greater magnitude than the low-amperage current;
the processor being configured to determine a voltage drop across the electrical path based on the difference between the first voltage and the second voltage.

2. The electrical test device of claim 1, wherein:
the electrical path has a normal operating range; and
the processor being configured to prevent the application of the high-amperage current pulse to the electrical path when the first voltage is outside of the normal operating range.

3. The electrical test device of claim 1, wherein:
the electrical path comprises a power feed having a high-voltage side and a low-voltage side;
the probe element being configured to be placed in contact with the low-voltage side; and
the probe element being configured to sink current into the test device during application of the relatively high-amperage current pulse.

4. The electrical test device of claim 1, wherein:
the electrical path comprises a power ground having a high-voltage side and a low-voltage side;
the probe element being configured to be placed in contact with the high-voltage side; and
the probe element being configured to source current into the electrical path during application of the relatively high-amperage current pulse.

5. The electrical test device of claim 1, wherein:
the processor being configured to determine an electrical resistance of the electrical path based on the voltage drop.

6. A method of measuring a voltage drop in a relatively low-impedance electrical path, comprising the steps of:
placing a single conductive probe element in contact with the electrical path;
energizing the probe element from an power supply;
applying, using the probe element, a relatively low-amperage current to the electrical path;
determining, using the processor, a first voltage across the electrical path in response to the application of the low-amperage current;
applying, using the probe element, a relatively high-amperage current pulse to the electrical path, the high-amperage current pulse being of greater magnitude than the low-amperage current;
determining, using the processor, a second voltage across the electrical path in response to the application of the high-amperage current pulse; and
determining, using the processor, a voltage drop across the electrical path based on the difference between the first voltage and the second voltage.

7. The method of claim 6, further comprising the step of:
indicating, using an indicating device, the voltage drop across the electrical path.

8. The method of claim 7 wherein the electrical path has a normal operating range, the method further comprising the step of:
preventing the application of the high-amperage current pulse to the electrical path when the first voltage is outside of the normal operating range.

9. The method of claim 7 wherein the electrical path comprises a power feed having a high-voltage side and a low-voltage side, the method further comprising the steps of:
placing the probe element in contact with the low-voltage side; and
sinking current from the electrical path into the test device during application of the current pulse.

10. The method of claim 7 wherein the electrical path comprises a power ground having a high-voltage side and a low-voltage side, the method further comprising the steps of:
placing the probe element in contact with the high-voltage side; and
sourcing current from the test device into the electrical path during application of the current pulse.

* * * * *